US006292036B1

(12) United States Patent
Archer

(10) Patent No.: US 6,292,036 B1
(45) Date of Patent: Sep. 18, 2001

(54) DRIVE CIRCUIT

(75) Inventor: Michael Anthony Archer, Twickenham (GB)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/525,351

(22) Filed: Mar. 15, 2000

(30) Foreign Application Priority Data

Mar. 16, 1999 (GB) .................................................. 9905897

(51) Int. Cl.[7] ........................................................ H03B 1/00

(52) U.S. Cl. ............................................ 327/110; 123/478

(58) Field of Search .................................... 327/108, 109, 327/110, 112; 326/82, 83, 88; 123/478, 490, 650

(56) References Cited

U.S. PATENT DOCUMENTS 4,961,006 * 10/1990 Pace et al. ........................... 327/109
5,264,736 * 11/1993 Jacobson .............................. 327/365
5,729,164 * 3/1998 Pattantyus ............................ 327/110
5,760,619 * 6/1998 Yamaguchi .......................... 327/110

* cited by examiner

*Primary Examiner*—Kenneth B. Wells
*Assistant Examiner*—Paul Dinh
(74) *Attorney, Agent, or Firm*—John A. VanOphen

(57) ABSTRACT

A drive circuit for controlling at least one device having first and second electromagnetically operable actuators, the drive circuit having first and second terminals for connection to a voltage supply and comprising a first controllable switch in connection with one side of the actuators and the first terminal. Each actuator has an associated second controllable switch in connection with the other side of the respective actuator, whereby opening and closing of the first and second switches serves to control selection and actuation of the actuators. The circuit further comprises a sensor arrangement for providing independent sensing of the current flowing through each of the actuators, each actuator having an associated diode in connection with the respective second controllable switch to ensure current flows through the sensor arrangement when the first controllable switch is opened and the second controllable switch is closed.

9 Claims, 4 Drawing Sheets

DRIVE CIRCUIT

TECHNICAL FIELD

The invention relates to a drive circuit for a device having two electromagnetically operable actuators. In particular, the invention relates to a drive circuit for a dual-valve fuel injector, forming part of the fuel system of a vehicle internal combustion engine, the fuel injector having two electromagnetically operable actuators, one for each of the two valves.

BACKGROUND OF THE INVENTION

In conventional fuel injectors there is a single actuator for a spill control valve controlled by means of a drive circuit. A drive circuit for controlling a four cylinder internal combustion engine having four fuel injectors is described in PCT application WO96/27198. The actuator for each fuel injector valve has a winding through which a current is passed to actuate the valve. A first controllable switch (commonly referred to as the high side switch) is connected in series between one end of the winding forming part of each actuator and a first terminal of the drive circuit connected to the positive terminal of a DC supply. The high side switch is therefore connected to one end of each of the four actuators. Additionally, a diode is connected in the path between the DC supply and the high side switch.

The other end of each winding is connected in series to a second controllable switch (commonly referred to the low side switch), which in turn is connected to the negative terminal of the DC supply via a resistor. The current flowing through each winding can be determined by means of this resistor. In addition, the anode connection of a second diode, one associated with each winding, is in connection with the end of the winding connected to the respective low side switch. The cathode connection of each second diode is in connection with the negative terminal of the DC supply via a capacitor. Thus, depending on whether the low side switch of the associated winding is switched on or off, the winding of each valve connects to the negative terminal of the battery either via a capacitor or by means of the resistor.

When it is required to actuate one of the valves, the current in the associated winding is allowed to rise to a high value and is then allowed to fall to a lower value after which it is maintained for a period at a mean level by subjecting the high side switch to a modulated pulse, thereby serving to regulate the current flow through the windings, until such time as the current is turned off to de-actuate the valve.

In more recently developed internal combustion engines, dual-valve fuel injectors are to be employed, each fuel injector having a spill valve and a nozzle control valve requiring independent control by an associated actuator. Thus, there is a requirement for a drive circuit for controlling an assembly of fuel injectors each having two actuators. For this purpose it would be possible to employ the drive circuit for a conventional single-actuator fuel injector assembly, as hereinbefore described. However, in order to do so, a duplicate of each circuit component is required for the additional actuator in each fuel injector. This requires a drive circuit of considerable complexity. In particular, four wire connections are needed to each fuel injector from the DC supply, two for each winding of each actuator. This is particularly difficult to accommodate within a single fuel injector body.

It is an object of the present invention to provide a drive circuit for a dual-actuator fuel injector having reduced complexity.

SUMMARY OF THE INVENTION

According to the present invention there is provided a drive circuit for controlling at least one device having first and second electromagnetically operable actuators, the drive circuit having first and second terminals for connection to voltage supply means and comprising a first controllable switch in connection with one side of the actuators and the first terminal, each actuator having an associated second controllable switch in connection with the other side of the respective actuator, whereby opening and closing of the first and second switches serves to control selection and actuation of the actuators, the drive circuit further comprising sensing means for providing independent sensing of the current flowing through each of the actuators, each actuator having an associated diode in connection with the respective second controllable switch to ensure current flows through the sensing means when the first controllable switch is opened and the second controllable switch is closed.

The drive circuit provides the advantage that dual-actuator device can be powered with a more simplified circuit than is possible using a conventional means. In particular, the drive circuit limits the numbers of connection required to the actuators. This is particularly important when the drive circuit is used to implement control of valve actuators in a dual-valve fuel injector system.

Furthermore, the drive circuit enables independent sensing of the current in each actuator. Therefore current glitch detection may be performed independently for each actuator during the period in which current flows through the sensing means. Current glitch detection is important in fuel injector control as it provides a means of determining when valve closure occurs.

The sensing means may be provided by two resistors, one resistor being associated with a different one of the two actuators, each resistor being connected on one side to the second controllable switch associated with the respective actuator.

The drive circuit may be controlled by an electronic control unit, providing switching pulses to the first and second controllable switches. The switching control pulses include current glitch detection pulses to initiate switching of the first and second controllable switches when current sensing is required.

The drive circuit may further comprise a blocking diode connected between each actuator and the respective second controllable switch to prevent any unintentional short-circuit current flow through the respective actuator. Preferably, the blocking diodes are located within the electronic control unit (ECU).

In a preferred embodiment of the invention, the drive circuit controls a plurality of devices arranged in two banks, the drive circuit comprising separate first controllable switches for each of the two banks, the second controllable switches being arranged such that each second controllable switch is common to actuators of devices in both banks.

The drive circuit may be powered by a DC supply voltage connected to the first and second terminals.

Alternatively, the drive circuit may further comprise a third controllable switch to enable mixed-voltage operation, whereby selection of a higher voltage supply provides an initial higher current to an actuator to initiate actuation thereof and selection of a lower voltage supply provides a subsequent lower current to the actuator sufficient to hold the actuator in a desired position within the device, selection being effected by switching of the third controllable switch.

BRIEF DESCRIPTION OF THE DRAWINGS

The present invention will now be described, by way of example only, with reference to the following figures in which;

FIGS. 2(*c*) and 2(*b*) shows control pulses which may be employed to control the drive circuit shown in FIG. 1;

DESCRIPTION OF THE PREFERRED EMBODIMENT

Figure 1:
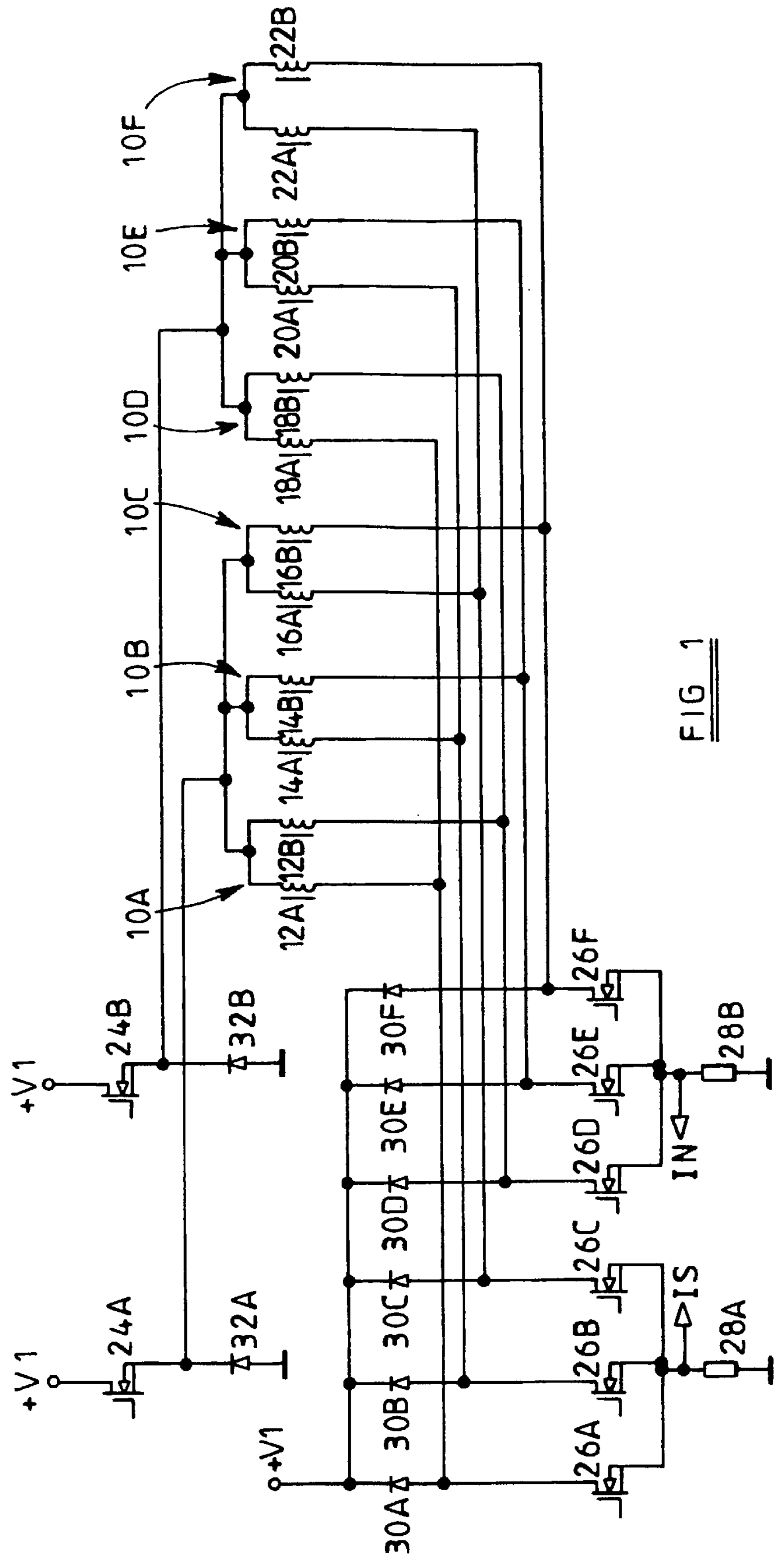
FIG. 1 is a first embodiment of the drive circuit of the present invention for controlling six fuel injectors, each injector having two actuators.

FIG. 1 shows an assembly of six dual-valve fuel injectors 10A–10F, arranged in two banks, 10A–10C and 10D–10F. Each fuel injector has two actuators, one for controlling each of its two valves. The actuators are denoted by references 12A,12B, 14A,14B, 16A,16B, 18A,18B, 20A,20B and 22A, 22B. One of the valves of each fuel injector is a spill valve, corresponding to actuators denoted with a reference sign 'A', and the other valve is a nozzle control valve, corresponding to actuators denoted with a reference sign 'B'. Each actuator comprises a winding through which a current may be passed to actuate the associated valve.

The actuators 12A–22A and 12B–22B are controlled by means of two high side switches 24A,24B and six low side switches 26A–26F. Preferably, the switches are field effect transistors (FETs). The low side switches 26A–F are arranged such that each one controls two actuators of the same type i.e. each low side switch 26A–26F either controls two actuators for spill valves or two actuators for nozzle control valves. The low side switches 26A–26F and the high side switches 24A,24B are under the control of an electronic control unit (ECU) (not shown) which would be familiar to a person skilled in the art and will not be described in further detail. Preferably, the high and low side switches may be located within the ECU.

The low side switches are arranged in two banks, 26A–26C and 26D–26F, each bank having an associated resistor 28A,28B. Each bank of fuel injectors 10A–C and 10D–F is connected to a different one of the high side switches 24A,24B. The actuator connections to the high side switches 24A,24B are such that each of the two actuators sharing a common low side switch is connected to a different one of the high side switches 24A,24B. For example, the actuators 12A and 18A are connected, on one side, to the low side switch 26A whereas the other side of actuator 12A is connected to the high side switch 24A, the other side of actuator 18A being connected to the high side switch 24B. In addition, the sides of each actuator 12A and 18A, sharing the common low side switch 26A, are also connected to the anode of a diode 30A, the cathode of which is connected to a DC supply V1. Diodes 30A–30F connected in this way are included for each of the actuator pairs sharing a common low side switch 26A–26F.

The high side switches 24A,24B are connected on one side to a DC supply V1, typically a 50V supply, and on the other side to the cathode of an associated diode, 32A and 32B respectively, the anode of each diode 32A,32B being connected to ground.

The arrangement is such that independent current sensing, by means of the resistors 28A,28B, is possible for each of the actuators 12A–22A, 12B–22B. Independent current sensing through each of the actuators is desirable as it enables current glitch detection to be performed, as will be described hereinafter. Furthermore, it is necessary that the fuel injectors 10A–10B can be operated sequentially without overlapping.

With the high side switch 24A closed, actuation of each of the actuators 12A,14A, 16A, 12B,14B,16B of the first bank of fuel injectors 10A–10C is achieved by closing the appropriate low side switch 26A–26F. Actuator selection and current holding in a selected actuator is performed by each low-side switch with the corresponding high side switch turned on. Recirculation occurs through the high side switch 24A, and the corresponding diode 30A–30F, when the corresponding low side switch is turned off.

The drive circuit will now be described in detail with reference to fuel injector 10A, comprising actuators 12A and 12B. FIG. 2(*a*) shows the current waveform, $I_S$, through the winding of actuator 12A controlling the spill valve and FIG. 2(*d*) shows the current waveform, $I_B$, through the winding of actuator 12B controlling the nozzle valve. The continuous lines shown in FIGS. 2(*a*) and 2(*d*) represent the current which is sensed by the sensing resistor, 28A or 28B, whereas the dashed line portions 70,72 represent the actual current flowing through the actuator winding.

With reference to FIG. 2(*a*), at time t1, the current, $I_S$, through actuator 12A increases at a high rate, during which period both the high and low side switches 24A,26A are closed. When the peak current value, $I_{SMAX}$, is reached the high side switch 24A is opened and the current decays at a slower rate through the resistor 28A, providing the low side switch 26A remains closed. If the high side switch 24A is closed again, the current, $I_S$, will start to increase. If the low side switch 26A is opened, and with the high side switch closed, recirculation occurs through the high side switch 24A and diode 30A, causing the current through the winding of the actuator to decay. Thus, by opening and closing the low side switch 26A, the current, $I_S$, through the actuator 12A can be held about a mean holding value, as shown in FIG. 2(*a*), with the current decaying when the low side switch 26A is open and the current increasing when the low side switch 26A is closed. Pulsing the low side switch 26A in this way thereby serves to regulate the current through the winding of the actuator 12A. The opening and closing of the low side switch 26A will be referred to as the "chopping mode".

In the chopping mode, the actuator 12A is supplied with the mean holding current such that it actuates upon the spill valve to hold it in the desired position within the fuel injector 10A. When it is required to de-actuate the spill valve, both the high side switch 24A and the low side switch 26A are opened to allow rapid decay of the current, $I_S$, to zero.

The operation above has been described with reference to control of the actuator 12A by means of switches 24A and 26A. Simultaneously with this, actuator 12B for controlling the nozzle control valve of the fuel injector 10A is also controlled by high side switch 24B and low side switch 26D. FIG. 2(*d*) shows the current waveform, $I_N$, in the actuator 12B controlling the nozzle control valve of fuel injector 10A. The current increase is initiated at time t3 by closing the low side switch 26D (the high side switch 24A already being closed). As described previously for actuator 12A, the current is increased to a maximum value at which time the low side switch 26D is opened so that the current recirculates back through the high side switch 24A and diode 30D. Following this, the current can be maintained at a mean holding value, using the chopping mode as described above, by opening and closing the low side switch 26D.

It is an important feature of fuel injector operation to be able to determine precisely when valve closure has occurred. This is done by means of current glitch detection i.e. detecting the glitch in the current through the actuator winding at the instant valve closure occurs. In order to perform current glitch detection, it is essential to be able to monitor the current through the sensing resistor 28A during current recirculation. In the drive circuit shown in FIG. 1, recirculation occurs through the closed high side switch 24A and diode 30A when the low side switch 26A is open, and it is not therefore possible to sense the current, $I_S$, during this recirculation time as the current, $I_S$, is not then passing through the sensing resistor 28A. It is therefore necessary to employ a control scheme whereby the high side switch 24A is opened and the low side switch 26A is closed, for a fixed or predetermined period, to enable current sensing in the resistor 28A.

This is done by means of glitch window pulse, GW1, as shown in FIG. 2(*b*) which is used to open and close the high and low side switches 24A,26A. The glitch window pulse GW1 is provided by the ECU as for the other switch control pulses. By opening the high side switch 24A and closing the low side switch 26A when the current, $I_S$, through actuator 12A reaches the maximum value, recirculation is forced through the sensing resistor 28A, thereby enabling the current to be sensed. During this recirculation period, current glitch detection can therefore be performed as the current is flowing through the sensing resistor 28A, the current decaying at a low rate.

As for actuator 12A control, glitch window GW2 can be used to open the high side switch 24A and to close the low side switch 26D to enable the recirculating current associated with actuator 12B to be sensed by means of resistor 28B. Thus, current glitch detection can be performed to determine when closure of the nozzle control valve occurs, at which time the chopping mode is initiated to provide the mean holding current required to hold the nozzle valve in the required position.

An advantage of the drive circuit of the present invention is that, because the low side switch 26D is not on the same low side switch bank as switch 26A, the current through actuator 12B can be sensed independently from the current through corresponding actuator 12A as the recirculating current in each case is sensed by a different resistor 28A, 28B. It will be appreciated that it is important to ensure that the current waveforms applied to the two actuators of a common fuel injector (e.g. actuators 12A and 12B) are chosen such that glitch windows can be introduced at the desired time on one of the actuators without substantially affecting the operation of the other.

Figures 2A, 2B, 2C, 2D:
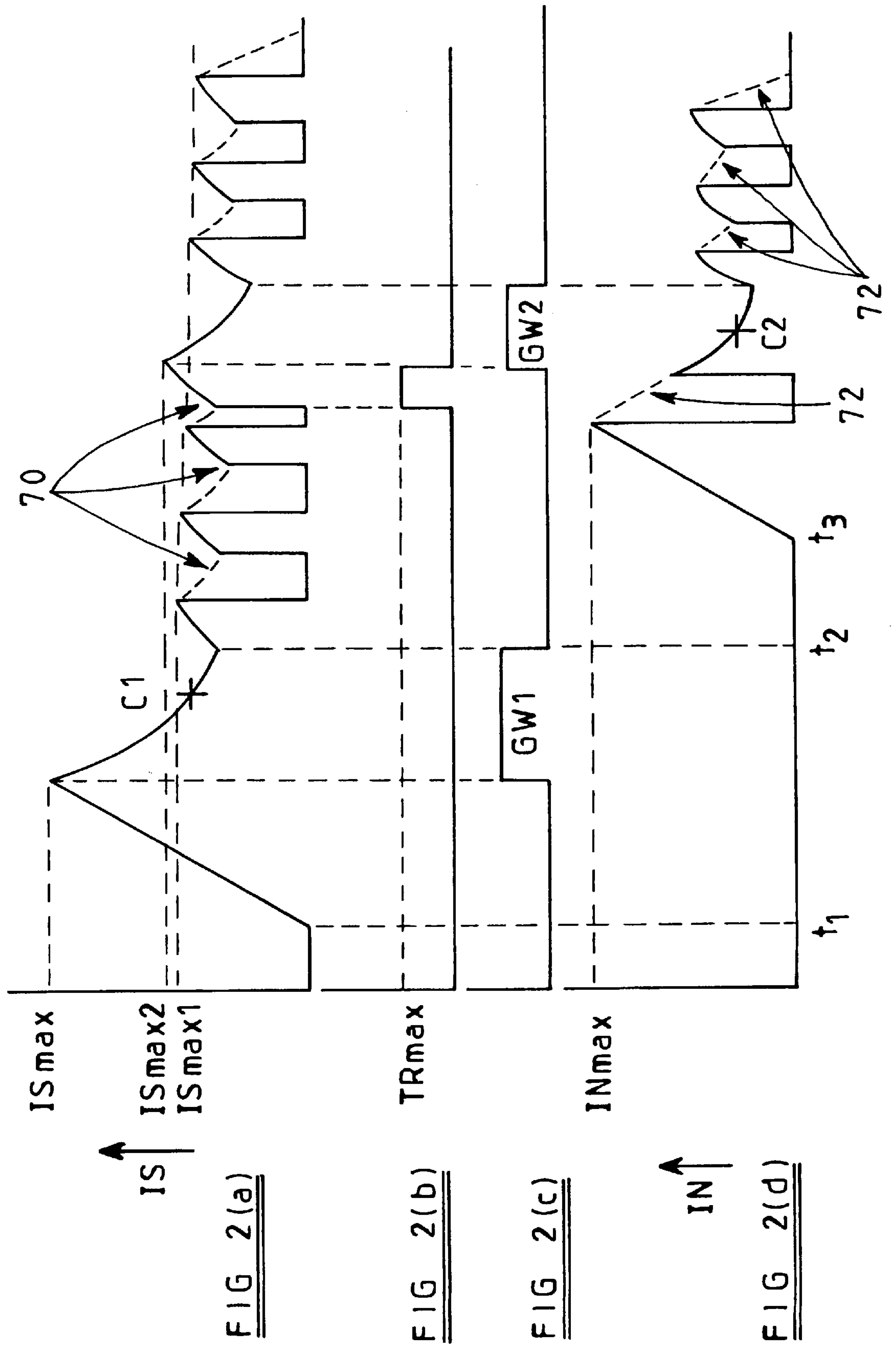
FIGS. 2(*a*) and 2(*d*) show current waveforms through the windings of the actuators in one of the dual-valve fuel injectors shown in FIG. 1.

In addition to the glitch window pulses, GW1 and GW2, an additional pulse, $T_{RMAX}$, may be used, as shown in FIG. 2B. The pulse, $T_{RMAX}$, is initiated immediately before glitch window pulse GW2 is applied and serves to maintain the high side switch 24A in the closed position and the low side switch 26A in the closed position for a fractionally longer period than when in regular chopping mode, such that the current $I_S$ increases above the value of $I_{SMAX1}$ to the slightly higher value $I_{SMAX2}$. In this way, the decay of current $I_S$ is prevented from decaying to too low a value during glitch window pulse GW2.

Control of each of the actuators of the five other fuel injectors, 10B–10F, can be implemented in the same way as described above for actuators 12A and 12B of fuel injector 10A. It will be appreciated that for any particular actuator, a relatively fast current decay occurs in recirculation mode when the corresponding low side switch and the corresponding high side switch are both open. If, at this time, the other low side switch associated with the same high side switch remains closed, the current decay in the actuator corresponding to this other low side switch will decay slowly.

The drive circuit enables independent current sensing in each of the actuators of a dual-valve fuel injector, while requiring only marginally more complex sensing circuitry than is required for a single-valve fuel injector. It is possible to interchange the high side switches 24A,24B with the low side switches 26A–26F such that the current sensing resistor 28A,28B are located in connection with the high side switches 24A,24A. However, this does have the undesirable effect of there being a high, common voltage across the resistors 28A,28B.

Figure 3:
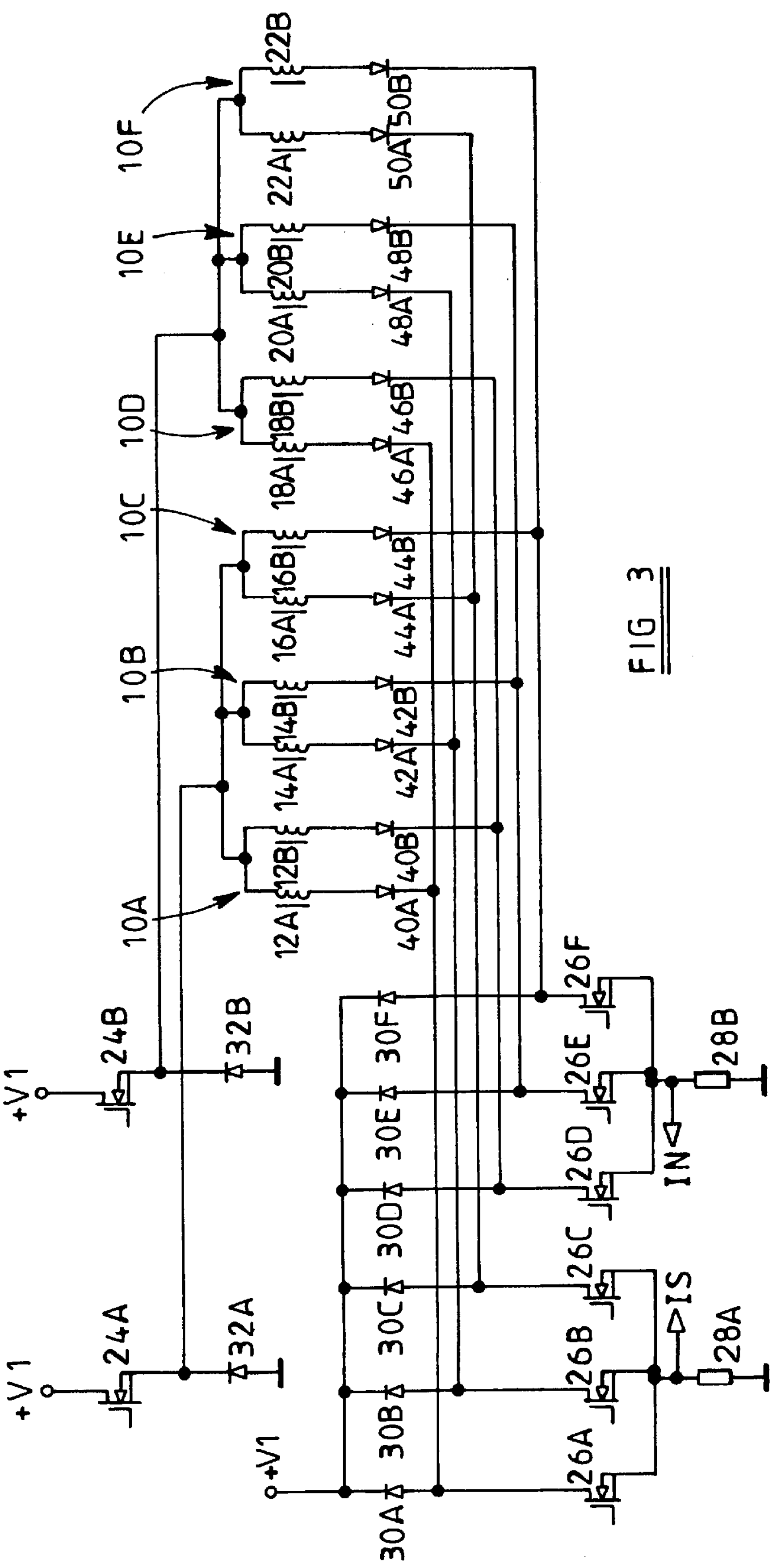
FIG. 3 is a modification of the drive circuit shown in FIG. 1, having improved fault tolerance.

FIG. 3 shows a modification of the control circuit shown in FIG. 1 which has an improved level of fault tolerance. In the circuit shown in FIG. 3, series blocking diodes 40A,40B, 42A,42B, 44A,44B, 46A,46B,48A,48B, 50A,50B are included in the path between the actuators 12A, 12B–22A–22B and their respective low side switches 26A–26F. In the event that a short circuit to ground occurs in one of the fuel injectors 10A–10B, the diodes 40A, 40B–50A,50B ensure that no current can flow back through the shorted connection. Thus, the three fuel injectors of the other fuel injector bank, 10–10C or 10D–10F, can still be kept running, providing a so-called"limp home capability". The diodes also provide the advantage that any small currents which may undesirably flow through a unpowered actuator during the time when a powered actuator is in recirculation mode, are blocked.

Preferably, the diodes 40A,40B–50A,50B should be arranged close to or inside the ECU providing the drive circuit control pulses to protect against the fuel injector return wires shorting to ground. Locating the diodes 40A, 40B–50A,50B within the ECU does, however, require six additional connectors on the ECU. Alternatively, the diodes may be located with the ECU connector cover, although may give rise to manufacturing difficulties.

The actuators of the fuel injectors 10A–10F shown in FIGS. 1 and 3 are powered by means of a DC supply, V1, typically supplying 50V. Conventionally, however, in fuel injector assemblies comprising a number of single-valve fuel injectors, a high voltage regulated supply can be used to power the actuators by means of a battery voltage, such as a 12V car battery, in combination with a booster converter and by storing energy in a tank capacitor which is subsequently used to power the actuators. Such a scheme may also be used in conjunction with the present invention. However, the drive circuit of the present invention requires more power than an assembly of single-valve fuel injectors due to the increased number of actuators in the assembly. This requires the use of a booster converter of increased size.

Figure 4:
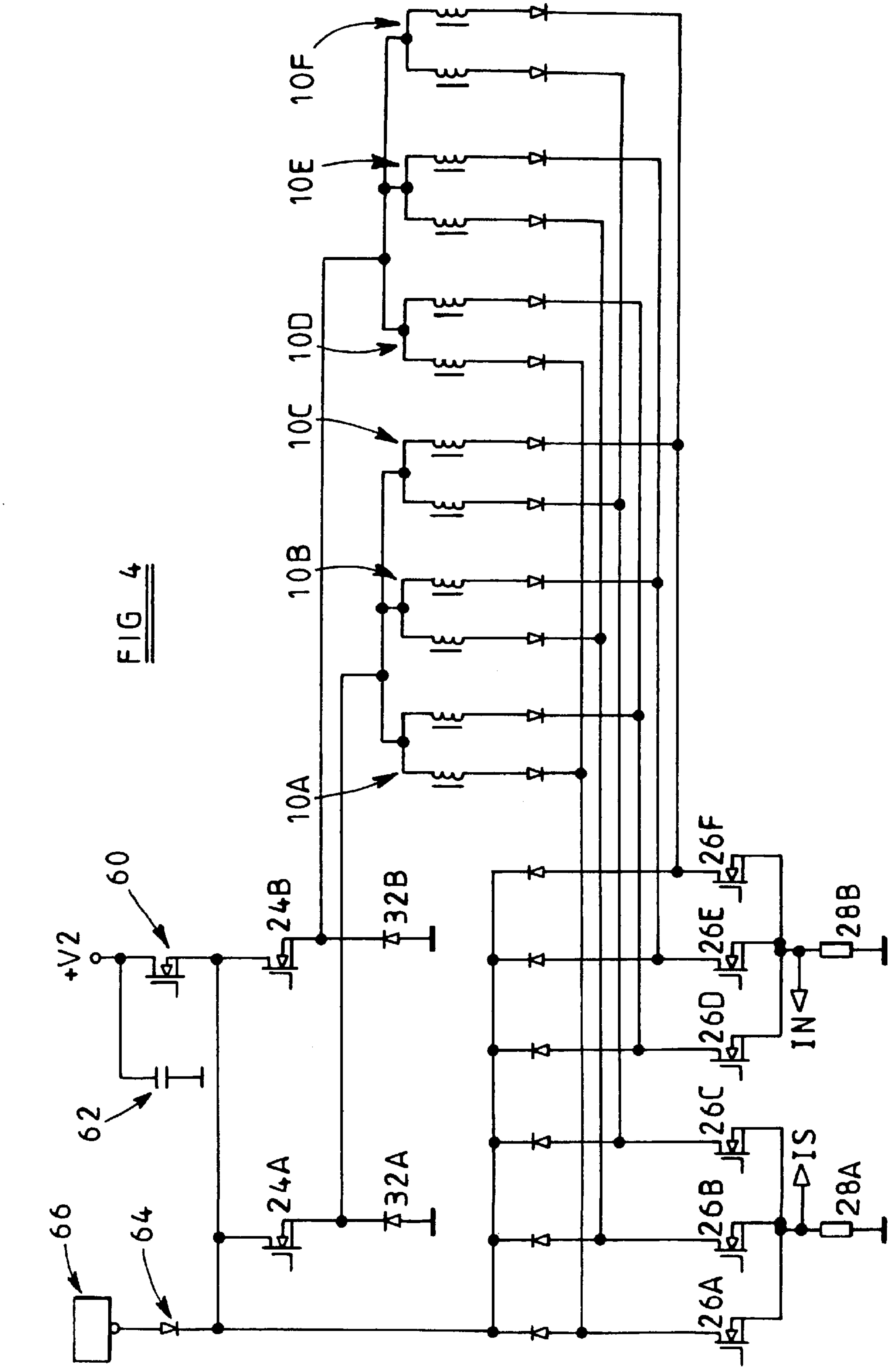
FIG. 4 is a further modification of the drive circuits shown in FIGS. 1 and 3 for mixed-voltage operation.

Alternatively, with reference to FIG. 4, mixed-voltage operation may be employed whereby a battery voltage, such as a 12V car battery voltage, is used to supply the chopping mode current and a higher voltage is used to generate the fast current rise e.g. after time t1 in FIG. 2(*a*). As in FIGS. 1 and 3, the control circuit shown in FIG. 4 comprises two high side switches 24A and 24B connected to the cathode of a blocking diode 32A and 32B respectively, the anode of each blocking diode being connected to ground. High side switch 24B is connected to a further switch 60, referred to as a high boost switch, connecting the high side switch 24B to a high voltage supply, V2, typically 50V. The high boost switch 60 is connected to ground via a tank capacitor 62. A battery 66, such as a 12V car battery, also supplies power to the high side switches 24A,24B (i.e. in place of voltage supply V1 in FIGS. 1 and 3) through a diode 64 to prevent current flow back to the battery 66.

When the high boost switch 60 is closed, the high supply voltage supplies the current required for the fast current increase upon e.g. after time t1 in FIG. 2(*a*). When the switch 60 is opened, the battery voltage 66 is available, via the diode 64, to provide the chopping mode holding current. Thus, by controlling the opening and closing of the high boost switch 60, either a higher supply voltage (V2) or a lower voltage (battery 66) can be supplied to the selected actuator.

For a selected fuel injector, a relatively fast current decay occurs in both actuators when both the corresponding low side switches and the corresponding high side switch are open. The inductive energy stored in the actuators is returned to the high voltage supply V2 via the"parasitic" diode between the source and the drain of the high boost switch 60. If one of the low side switches associated with the same high side switch remains closed, the current will decay more slowly in the actuator and the current in the other actuator of the fuel injector will decay at the faster rate, returning its energy to the high voltage supply V3.

It will be appreciated that although mixed-voltage operation, provided by DC supply V3 and battery 66, is shown in FIG. 4 in combination with the use of series blocking diodes 40A,40B–50A,50B, mixed voltage operation may also be employed in embodiments of the invention which do not include these diodes.

The fuel injector assemblies shown in FIGS. 1, 3 and 4 may be employed in an internal combustion engine having six cylinders, one fuel injector 10A–10F being associated with a different one of the six cylinders and each fuel injector having two valves. It will be appreciated, however, that the control circuit may be adapted to control an increased or reduced number of dual-valve fuel injectors.

What is claimed is:

1. A drive circuit for controlling at least one device having first and second electromagnetically operable actuators, the drive circuit having first and second terminals for connection to a voltage supply and comprising a first controllable switch in connection with one side of the actuators and the first terminal, a respective second controllable switch associated with each of said first and second actuators for connection with the other side of a corresponding one of said first and second actuators, whereby said first and second switches control selection and actuation of the actuators, the drive circuit further comprising a sensor arrangement for providing independent sensing of the current flowing through each of the actuators, each actuator having an associated diode in connection with the respective second controllable switch to ensure current flows through the sensor arrangement when the first controllable switch is opened and the second controllable switch is closed.

2. A drive circuit for controlling at least one device having first and second electromagnetically operable actuators, the drive circuit having first and second terminals for connection to a voltage supply and comprising a first controllable switch in connection with one side of the actuators and the first terminal, each actuator having an associated second controllable switch in connection with the other side of the respective actuator, whereby the first and second switches control selection and actuation of the actuators, the drive circuit further comprising a sensor arrangement for providing independent sensing of the current flowing through each of the actuators, the sensor arrangement including two resistors, one resistor being associated with a different one of the two actuators, each resistor being connected on one side to the second controllable switch associated with the respective actuator, each actuator having an associated diode in connection with the respective second controllable switch to ensure current flows through the sensor arrangement when the first controllable switch is opened and the second controllable switch is closed.

3. The drive circuit as claimed in claim 2, further comprising an electronic control unit arranged to provide switching pulses to the first and second controllable switches.

4. The drive circuit as claimed in claim 3, wherein the electronic control unit is arranged to provide switching control pulses which include current glitch detection pulses to initiate switching of the first and second controllable switches when current sensing is required.

5. The drive circuit as claimed in claim 2, further comprising a blocking diode connected between each actuator and the respective second controllable switch to prevent any unintentional short-circuit current flow through the respective actuator.

6. The drive circuit as claimed in claim 5, wherein the blocking diodes are located within an electronic control unit.

7. The drive circuit as claimed in claim 2, the drive circuit being arranged to control a plurality of devices arranged in two banks and comprising separate first controllable switches for each of the two banks, the second controllable switches being arranged such that each second controllable switch is common to actuators of devices in both banks.

8. The drive circuit as claimed in claim 2, wherein the circuit is arranged to be powered by a DC supply voltage connected to the first and second terminals.

9. The drive circuit as claimed in claim 2, further comprising a third controllable switch to enable mixed-voltage operation, whereby selection of a higher voltage supply provides an initial higher current to an actuator to initiate actuation thereof and selection of a lower voltage supply provides a subsequent lower current to the actuator sufficient to hold the actuator in a desired position within the device, selection being effected by switching of the third controllable switch.

* * * * *